(12) United States Patent
Lee et al.

(10) Patent No.: US 11,088,193 B2
(45) Date of Patent: Aug. 10, 2021

(54) IMAGE SENSOR AND AN IMAGE PROCESSING DEVICE INCLUDING THE SAME

(71) Applicant: SAMSUNG ELECTRONICS CO., LTD., Suwon-si (KR)

(72) Inventors: Gwi-Deok Ryan Lee, Suwon-si (KR); Myung Won Lee, Hwaseong-si (KR); Tae Yon Lee, Seoul (KR); In Gyu Baek, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/661,346

(22) Filed: Oct. 23, 2019

(65) Prior Publication Data

US 2020/0066778 A1 Feb. 27, 2020

Related U.S. Application Data

(63) Continuation of application No. 15/470,152, filed on Mar. 27, 2017, now Pat. No. 10,522,581.

(30) Foreign Application Priority Data

Aug. 3, 2016 (KR) .................. 10-2016-0098816

(51) Int. Cl.
*H01L 27/146* (2006.01)
*H01L 27/30* (2006.01)
(Continued)

(52) U.S. Cl.
CPC .. *H01L 27/14634* (2013.01); *H01L 27/14621* (2013.01); *H01L 27/14627* (2013.01);
(Continued)

(58) Field of Classification Search
CPC ......................................... H01L 27/146–14893
See application file for complete search history.

(56) References Cited

U.S. PATENT DOCUMENTS 7,825,438 B2 11/2010 Jung et al.
8,451,362 B2 5/2013 Lee et al.
(Continued)

OTHER PUBLICATIONS

Office Action dated Apr. 8, 2019 in corresponding U.S. Appl. No. 15/470,152.
(Continued)

*Primary Examiner* — Tucker J Wright
(74) *Attorney, Agent, or Firm* — F. Chau & Associates, LLC

(57) ABSTRACT

An image sensor includes a semiconductor substrate providing a plurality of pixel regions, a semiconductor photoelectric device disposed in each of the plurality of pixel regions, an organic photoelectric device disposed above the semiconductor photoelectric device, and a pixel circuit disposed below the semiconductor photoelectric device. The pixel circuit includes a plurality of driving transistors configured to generate a pixel voltage signal from an electric charge generated in the semiconductor photoelectric device and the organic photoelectric device. A driving gate electrode of at least one of the plurality of driving transistors has a region embedded in the semiconductor substrate.

16 Claims, 17 Drawing Sheets

(51) Int. Cl.
  *H04N 5/378* (2011.01)
  *H04N 9/04* (2006.01)
(52) U.S. Cl.
  CPC .. *H01L 27/14645* (2013.01); *H01L 27/14647* (2013.01); *H01L 27/307* (2013.01); *H04N 5/378* (2013.01); *H04N 9/04* (2013.01)

(56) References Cited

U.S. PATENT DOCUMENTS

| | | |
|---|---|---|
| 8,614,759 B2 | 12/2013 | Watanabe et al. |
| 9,041,071 B2 | 5/2015 | Ahn |
| 2009/0014761 A1 | 1/2009 | Park |
| 2012/0193689 A1* | 8/2012 | Park .................. H01L 27/14647 257/290 |
| 2013/0341750 A1* | 12/2013 | Ichikawa .......... H01L 27/14647 257/440 |
| 2014/0160327 A1 | 6/2014 | Enoki et al. |
| 2015/0123179 A1 | 5/2015 | Kikuchi |
| 2015/0279899 A1 | 10/2015 | Kim et al. |
| 2015/0325721 A1 | 11/2015 | Toda |
| 2016/0020236 A1 | 1/2016 | Tanaka et al. |
| 2016/0020237 A1 | 1/2016 | Yamakawa |
| 2016/0049429 A1 | 2/2016 | Lee et al. |
| 2016/0087012 A1 | 3/2016 | Lee et al. |
| 2016/0218148 A1 | 7/2016 | Yamaguchi |
| 2016/0247848 A1 | 8/2016 | Nakamura et al. |
| 2017/0170239 A1 | 6/2017 | Lee et al. |
| 2018/0040657 A1 | 2/2018 | Lee et al. |

OTHER PUBLICATIONS

Office Action dated Apr. 6, 2018 in corresponding U.S. Appl. No. 15/470,152.

* cited by examiner

IMAGE SENSOR AND AN IMAGE PROCESSING DEVICE INCLUDING THE SAME

CROSS-REFERENCE TO RELATED APPLICATION

This application is a continuation of U.S. application Ser. No. 15/470,152 filed Mar. 27, 2017, which claims priority under 35 U.S.C. § 119 to Korean Patent Application No. 10-2016-0098816, filed on Aug. 3, 2016 in the Korean Intellectual Property Office, the disclosures of which are incorporated by reference herein in their entirety.

TECHNICAL FIELD

Exemplary embodiments of the inventive concept relate to an image sensor and an image processing device including the same.

DISCUSSION OF RELATED ART

Image sensors are commonly provided as semiconductor-based sensors receiving light and generating an electrical signal, and may include a pixel array having a plurality of pixels, a circuit to drive the pixel array, and the like. Image sensors may be widely applied to smartphones, tablet computers, laptop computers, televisions, or the like, as well as to cameras used to capture still images or shoot videos. An image sensor may include a plurality of photoelectric devices of which a single pixel generates an electric charge from light having different colors. To increase a degree of integration in a pixel circuit therein, sizes of transistors included in the pixel circuit may be reduced, which may result in degradation of properties of the transistors.

SUMMARY

According to an exemplary embodiment of the inventive concept, an image sensor may include a semiconductor substrate providing a plurality of pixel regions, a semiconductor photoelectric device disposed in each of the plurality of pixel regions, an organic photoelectric device disposed above the semiconductor photoelectric device, and a pixel circuit disposed below the semiconductor photoelectric device. The pixel circuit includes a plurality of driving transistors configured to generate a pixel voltage signal from an electric charge generated in the semiconductor photoelectric device and the organic photoelectric device. A driving gate electrode of at least one of the plurality of driving transistors has a region embedded in the semiconductor substrate.

According to an exemplary embodiment of the inventive concept, an image processing device may include an image sensor and a processor. The image sensor may include a plurality of pixels. Each of the plurality of pixels may include a first photoelectric device, a second photoelectric device, a first circuit, and a second circuit. The first photoelectric device and the second photoelectric device are stacked with each other and configured to generate an electric charge in response to light having different wavelengths. The first circuit and the second circuit are connected to the first and the second photoelectric devices, respectively, and configured to generate a pixel signal in response to the electric charge. The processor may be configured to generate image data from the pixel signal. The first circuit may include a first transmission transistor, a first driving transistor, a first reset transistor, and a first selection transistor. The second circuit may include a second driving transistor, a second reset transistor, and a second selection transistor. At least one of a first driving gate electrode and a second driving gate electrode, included in the first driving transistor and the second driving transistor, respectively, may have a region embedded in the semiconductor substrate.

According to an exemplary embodiment of the inventive concept, an image sensor may include a plurality of pixels. Each of the plurality of pixels may include a semiconductor substrate, a first photoelectric device configured to receive light and generate an electric charge, and a first pixel circuit connected to the first photoelectric device and including a first driving transistor. A region of a first driving gate electrode of the first driving transistor has a region embedded in an upper surface of the semiconductor substrate. A first gate insulating layer surrounds the region of the first driving gate electrode that is embedded in the semiconductor substrate.

BRIEF DESCRIPTION OF DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
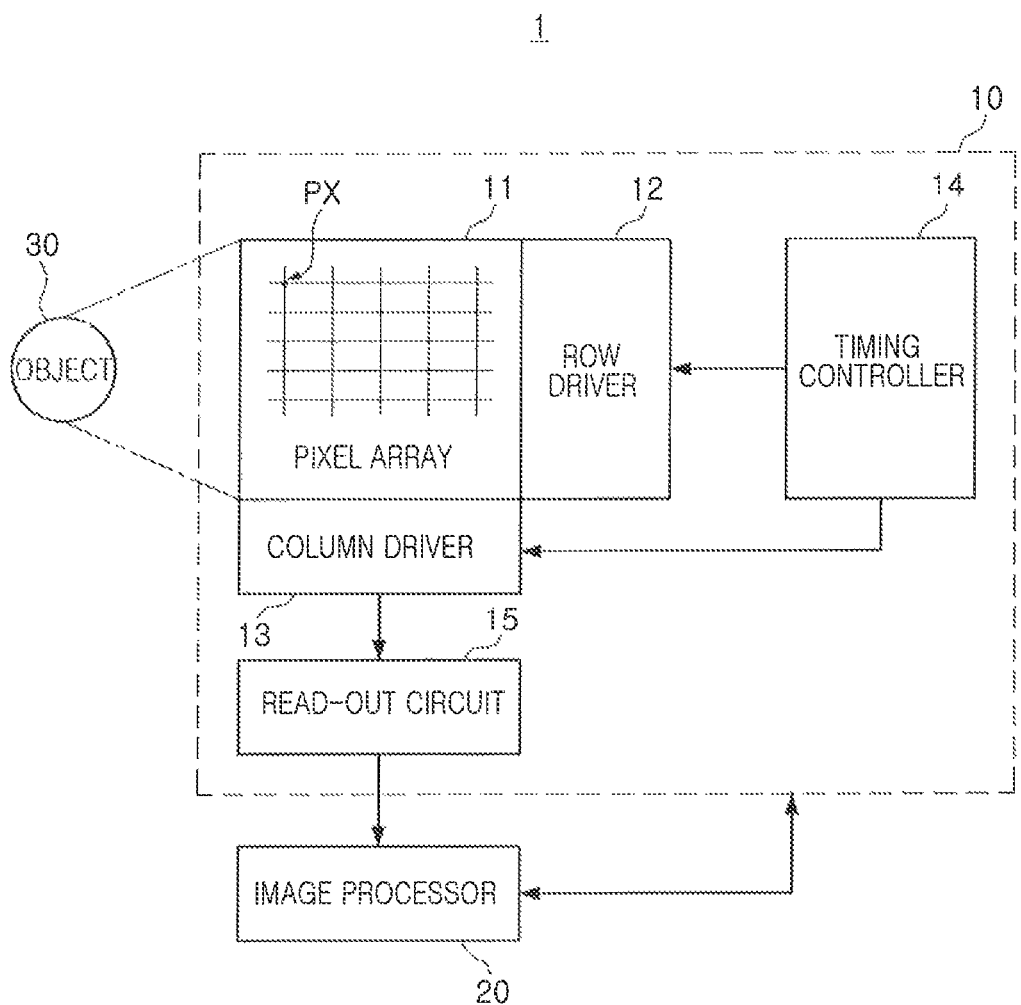
FIG. 1 is a block diagram of an image processing device according to an exemplary embodiment of the inventive concept.

Exemplary embodiments of the inventive concept will be described more fully hereinafter with reference to the accompanying drawings. Like reference numerals may refer to like elements throughout this application.

Exemplary embodiments of the inventive concept may provide an image sensor including a driving transistor and an image processing device including the image sensor.

FIG. 1 is a block diagram of an image processing device according to an exemplary embodiment of the inventive concept.

With reference to FIG. 1, an image processing device 1 may include an image sensor 10 and an image processor 20. The image sensor 10 may include a pixel array 11, a row driver 12, a column driver 13, a timing controller 14, a read-out circuit 15, and the like.

The image sensor 10 may be operated according to a control command of the image processor 20, and may convert light from an object 30 to an electrical signal and output the electrical signal to the image processor 20. The pixel array 11 included in the image sensor 10 may include a plurality of pixels PX. In addition, each of the plurality of pixels PX may include a photoelectric device, such as a photodiode (PD), configured to receive light and generate an electric charge. In an exemplary embodiment of the inventive concept, each of the plurality of pixels PX may include two or more photoelectric devices. In addition, the two or more photoelectric devices, included in a single pixel PX, may receive light having different colors and generate electric charge.

Each of the plurality of pixels PX may include a pixel circuit to generate the electrical signal from the electric charge generated by the photoelectric device. In an exemplary embodiment of the inventive concept, the pixel circuit may include a transmission transistor, a driving transistor, a selection transistor, a reset transistor, and the like. When a single pixel includes two or more photoelectric devices, the single pixel may include the pixel circuit to process the electric charge generated by the two or more photoelectric devices. In other words, when a single pixel includes two or more photoelectric devices, the pixel circuit may include two or more pixel circuits to process the electric charge and generate the electrical signal.

The row driver 12 may drive the pixel array 11 based on a row. For example, the row driver 12 may generate a transmission control signal for the transmission transistor, a reset control signal for the reset transistor, a selection control signal for the selection transistor, etc., in each pixel PX.

The column driver 13 may include a correlated double sampler (CDS), an analog-to-digital converter (ADC), and the like. The CDS may receive the electrical signal from the plurality of pixels PX included in a row selected by the row driver 12 and perform correlated double sampling. The ADC may convert output of the CDS into a digital signal and transmit the digital signal to the read-out circuit 15.

The read-out circuit 15 may include a latch or a buffer circuit, which may temporarily store the digital signal, and an amplifier circuit. The read-out circuit 15 may temporarily store or amplify the digital signal received from the column driver 13 and generate image data. Operation timing of the row driver 12, the column driver 13, and the read-out circuit 15 may be determined by a timing controller 14. In addition, the timing controller 14 may be operated by a control command transmitted by the image processor 20. The image processor 20 may process the image data transmitted by the read-out circuit 15. The image processor 20 may output the processed image data to a display device or the like, or may store the processed image data in a storage device, such as a memory or the like.

Figure 2:
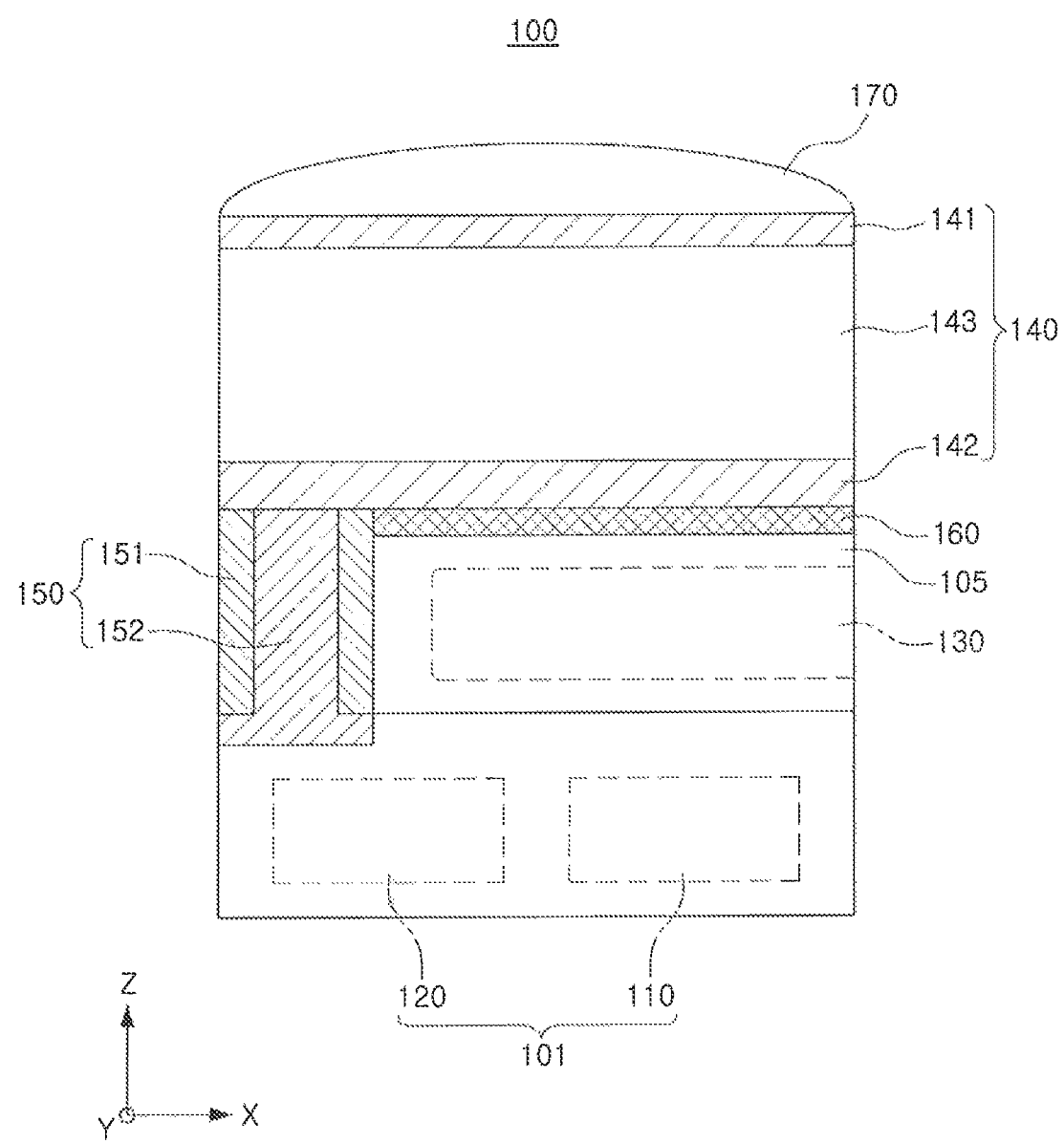
FIG. 2 is a view of a pixel included in an image sensor according to an exemplary embodiment of the inventive concept.

FIG. 2 is a view of a pixel included in an image sensor according to an exemplary embodiment of the inventive concept.

With reference to FIG. 2, a pixel 100 included in an image sensor (e.g., the image sensor 10 of FIG. 1) may include a first photoelectric device 130 disposed in a semiconductor layer 105, a second photoelectric device 140 and a microlens 170 disposed above the semiconductor layer 105, and a pixel circuit 101 disposed below the semiconductor layer 105. The pixel 100 may correspond to each of the pixels PX, which are arranged in an M×N matrix (where M and N are natural numbers) in the pixel array 11. In addition, an isolation region may be disposed between the pixels 100 (or PX) that are adjacent to each other. Light incident from an external source may be transmitted to the first photoelectric device 130 and the second photoelectric device 140 through the microlens 170.

The first photoelectric device 130 and the second photoelectric device 140 may be disposed in a stacking direction (e.g., a Z direction). The first photoelectric device 130 and the second photoelectric device 140 may receive light having different colors and generate electric charge. In an exemplary embodiment of the inventive concept, the first photoelectric device 130 may be provided as a semiconductor photoelectric device, such as a silicon photodiode. In addition, the second photoelectric device 140 may be provided as an organic photoelectric device, such as an organic photodiode. A color filter 160 may be disposed between the first photoelectric device 130 and the second photoelectric device 140.

The first photoelectric device 130 may receive light transmitted through the color filter 160 and generate electric charge. In an exemplary embodiment of the inventive concept, the color filter 160 may allow light having one color among red, green, and blue, and transmit the light to the first photoelectric device 130. A color of the light transmitted through the color filter 160 may be different from the color of light the second photoelectric device 140 receives.

The second photoelectric device 140 may include a first transparent electrode layer 141 and a second transparent electrode layer 142, which oppose each other, and further include a color selection layer 143 disposed therebetween. The color selection layer 143 may generate electric charge from light through a photoelectric effect, and may include an organic material. The color selection layer 143 may include a p-type layer of which a main carrier is a hole carrier and an n-type layer of which a main carrier is an electron carrier. The color selection layer 143 may generate electric charge in response to light having a specific wavelength. In an exemplary embodiment of the inventive concept, the color selection layer 143 may generate electric charge in response to green light. In this case, light having different colors except for green may be transmitted to the color filter 160.

The first transparent electrode layer 141 and the second transparent electrode layer 142 may include a transparent conductive material, such as indium tin oxide (ITO), indium zinc oxide (IZO), zinc oxide (ZnO), tin oxide ($SnO_2$), or the like, or a translucent material, such as a metal thin film or the like. In an exemplary embodiment of the inventive concept, the first transparent electrode layer 141 may have a work function higher than or the same as that of the second transparent electrode layer 142.

The pixel circuit 101 may include a first circuit 110 and a second circuit 120. Each of the first circuit 110 and the second circuit 120 may be connected to the first photoelectric device 130 and the second photoelectric device 140, and may generate an electrical signal from electric charge generated in each of the first photoelectric device 130 and the second photoelectric device 140.

The second circuit 120 may be connected to the second photoelectric device 140 by a via electrode 150. The via electrode 150 may include an insulating portion 151 and a conductive portion 152, and may extend along a side wall of the pixel 100 and connect the second photoelectric device 140 to the second circuit 120. In an exemplary embodiment of the inventive concept, a surface of the conductive portion 152 may be connected to the second transparent electrode layer 142 of the second photoelectric device 140, while an opposing surface of the conductive portion 152 may be connected to one circuit device among a plurality of circuit devices included in the second circuit 120. The insulating portion 151 may include an insulating material, such as silicon dioxide ($SiO_2$), silicon nitride (SiN), aluminum oxide ($Al_2O_3$), hafnium oxide (HfOx), or the like.

According to an exemplary embodiment of the inventive concept, an entirety of the first photoelectric device 130 and the second photoelectric device 140 may be provided as a semiconductor photoelectric device, or at least one photoelectric device of the first photoelectric device 130 and the second photoelectric device 140 may be provided as a quantum dot. In addition to the first photoelectric device 130 and the second photoelectric device 140, a different photoelectric device may also be stacked in the pixel 100, so that three or more photoelectric devices may be provided.

Figure 3A:
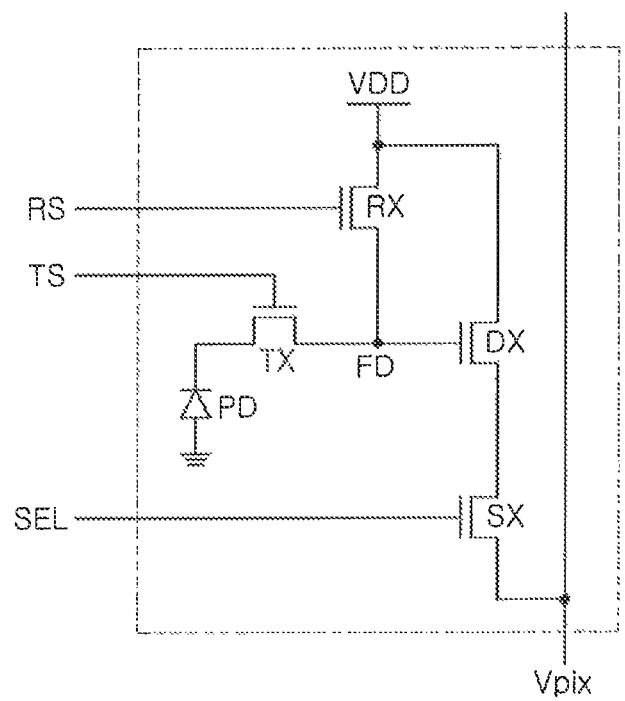
FIGS. 3A to 3C are circuit diagrams of a pixel circuit included in an image sensor according to exemplary embodiments of the inventive concept.
Figure 3B:
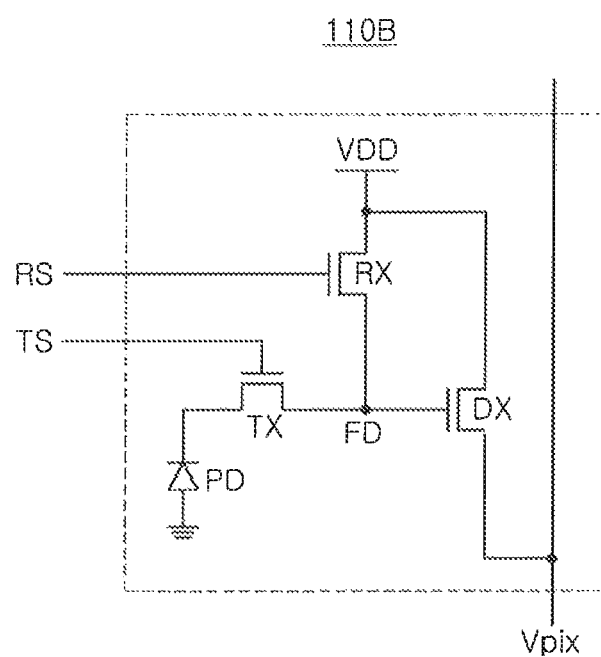
Figure 3C:
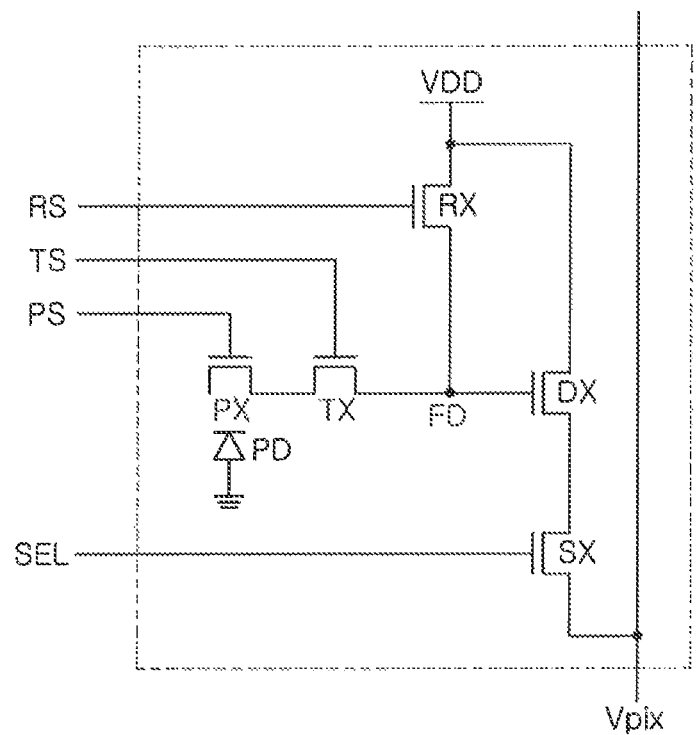

FIGS. 3A to 3C are circuit diagrams of a pixel circuit included in an image sensor according to exemplary embodiments of the inventive concept. The pixel circuit illustrated in FIGS. 3A to 3C may correspond to the first circuit 110 connected to the first photoelectric device 130, as illustrated in FIG. 2.

With reference to FIG. 3A, according to an exemplary embodiment of the inventive concept, a first circuit 110A included in pixels of an image sensor may include a plurality of transistors. The plurality of transistors may include a reset transistor RX, a driving transistor DX, a transmission transistor TX, and a selection transistor SX.

The first circuit 110A may be connected to a first photoelectric device PD (e.g., a semiconductor photoelectric device). Electric charge generated in the first photoelectric device PD may be transmitted to a floating diffusion FD through the transmission transistor TX and accumulated in the floating diffusion FD. The transmission transistor TX may be operated by a transmission control signal TS input to a gate electrode of the transmission transistor TX.

The driving transistor DX may be operated as a source follower amplifier by the electric charge accumulated in the floating diffusion FD. The driving transistor DX may amplify the electric charge accumulated in the floating diffusion FD and output an electrical signal Vpix, based on the electric charge, to the selection transistor SX.

The selection transistor SX may be operated by a selection control signal SEL to select one of the pixels 100 in the pixel array 11, and may undertake a switching and addressing operation. When the selection control signal SEL is applied by a row driver (e.g., the row driver 12 of FIG. 1), the selection transistor SX may output the electrical signal Vpix to a column line connected to the pixel 100.

The reset transistor RX may be operated by a reset control signal RS transmitted by the row driver 12 of FIG. 1. When the reset control signal RS is received, the reset transistor RX may reset a voltage of the floating diffusion FD to a power source voltage VDD.

FIG. 3B is a circuit diagram of a first circuit 110B according to an exemplary embodiment of the inventive concept. With reference to FIG. 3B, the first circuit 110B may include only the reset transistor RX, the driving transistor DX, and the transmission transistor TX.

In the present exemplary embodiment of FIG. 3B, the reset transistor RX may perform a function similar to that of the selection transistor SX illustrated in FIG. 3A so that the voltage of the floating diffusion FD is reset to the power source voltage VDD or set to a relatively low level voltage (e.g., 0V), in response to the reset control signal RS transmitted by the row driver 12 of FIG. 1.

FIG. 3C is a circuit diagram of a first circuit 110C according to an exemplary embodiment of the inventive concept. With reference to FIG. 3C, the first circuit 110C may include five transistors—the reset transistor RX, the driving transistor DX, the transmission transistor TX, the selection transistor SX, and a photo transistor PX.

Figure 4A:
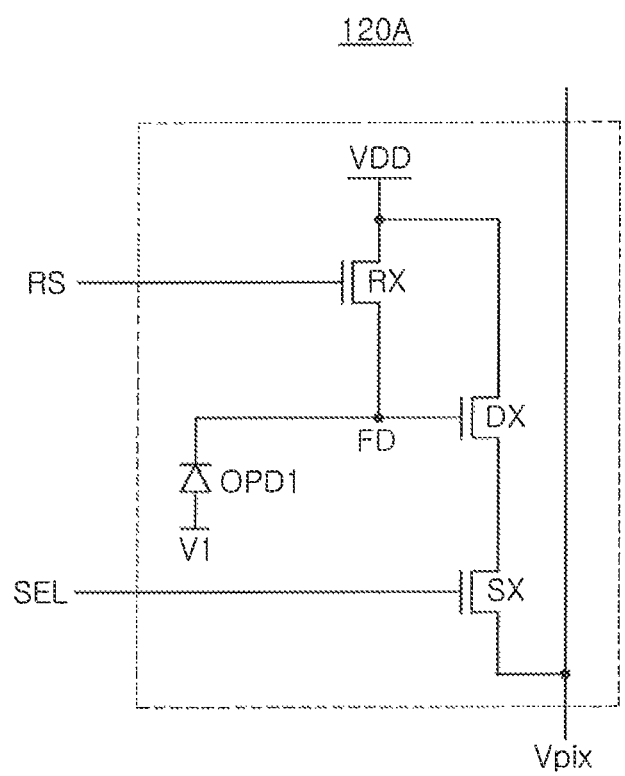
FIGS. 4A to 4C are circuit diagrams of a pixel circuit included in an image sensor according to exemplary embodiments of the inventive concept.
Figure 4B:
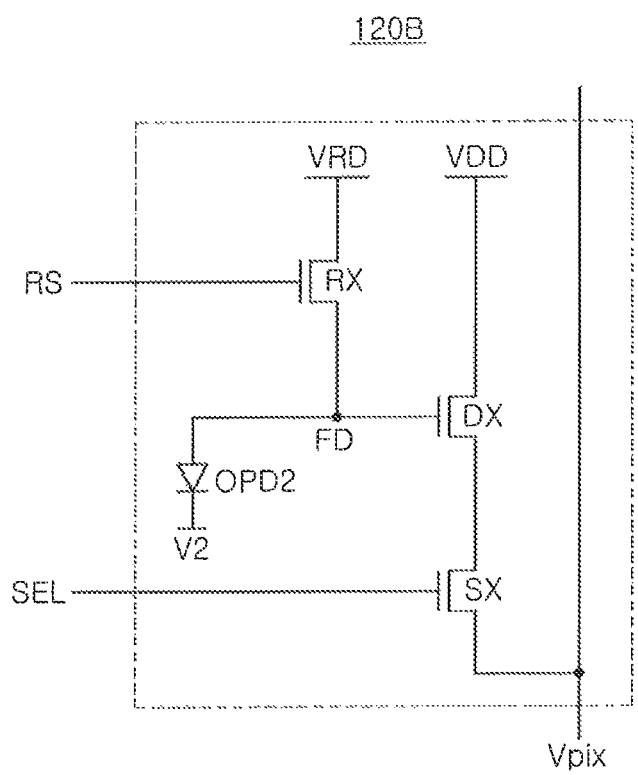
Figure 4C:
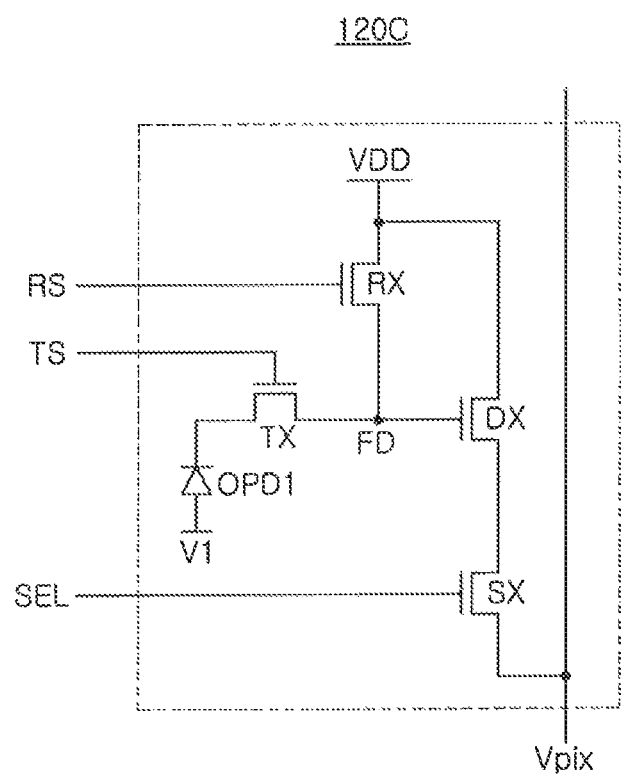

FIGS. 4A to 4C are circuit diagrams of a pixel circuit included in an image sensor according to exemplary embodiments of the inventive concept. The pixel circuit illustrated in FIGS. 4A to 4C may correspond to the second circuit 120 connected to the second photoelectric device 140, as illustrated in FIG. 2.

With reference to FIG. 4A, a second circuit 120A included in an image sensor, according to an exemplary embodiment of the inventive concept, may include the driving transistor DX, the reset transistor RX, and the selection transistor SX. A gate electrode of the driving transistor DX may be connected to the floating diffusion FD, while the floating diffusion FD may accumulate an electric charge generated in the second photoelectric device. In the present exemplary embodiment, the second photoelectric device may be an organic photoelectric device OPD1 including an organic material.

An operation of the second circuit 120A may be similar to that of the first circuit 110B, as described with reference to FIG. 3B. In the present exemplary embodiment of FIG. 4A, the organic photoelectric device OPD1 may generate an electron carrier as a main carrier. When the electron carrier is used as the main carrier, a cathode of the organic photoelectric device OPD1 may be connected to a first reference voltage V1, which has a ground voltage GND or a negative voltage in a range of −0.3 V to −0.5 V.

With reference to FIG. 4B, a second circuit 120B included in the image sensor, according to an exemplary embodiment of the inventive concept, may include the driving transistor DX, the reset transistor RX, and the selection transistor SX. An organic photoelectric device OPD2 connected to the second circuit 120B may use a hole carrier as the main carrier. When the hole carrier is used as the main carrier, the organic photoelectric device OPD2 may be connected to the floating diffusion FD in an opposite direction to that of FIG. 4A. In other words, the cathode of the organic photoelectric device OPD2 may be connected to the floating diffusion FD, while the anode of the organic photoelectric device OPD2 may be connected to a second reference voltage V2. In an exemplary embodiment of the inventive concept, the second reference voltage V2 may have a relatively low level, e.g., about 3.5 V. Due to the organic photoelectric device OPD2 having the hole carrier as the main carrier, a drain electrode of the reset transistor RX may be connected to a voltage different from the power source voltage VDD, for example, a read voltage VRD.

With reference to FIG. 4C, a second circuit 120C included in the image sensor, according to an exemplary embodiment of the inventive concept, may include the driving transistor DX, the reset transistor RX, the selection transistor SX, and the transmission transistor TX. In other words, the second circuit 120C may be similar to the first circuit 110A, as described with reference to FIG. 3A. The organic photoelectric device OPD1 in the present exemplary embodiment illustrated in FIG. 4C may be substituted with a different organic photoelectric device (e.g., the organic photoelectric device OPD2 using the hole carrier as the main carrier).

The first circuit 110 and the second circuit 120, described with reference to FIGS. 3A to 3C and FIGS. 4A to 4C, may be included in a single pixel 100. In other words, a single pixel 100 may include six or more transistors. As a number of transistors included in the pixel 100 is increased, a size of these transistors may be reduced. A reduction in the size of the driving transistor DX may lead to degradation of its properties (e.g., increased generation of random telegraph signal (RTS) noise). However, when the size of the driving transistor DX is increased to reduce RTS noise, a size of the pixel 100 may be increased, and thus, a degree of integration in the image sensor may be reduced.

In an exemplary embodiment of the inventive concept, at least one region of a gate electrode of the driving transistor DX may be embedded in a semiconductor substrate, thus increasing a length of a channel of the driving transistor DX. Therefore, properties of the driving transistor DX may be prevented from being degraded, without a reduction in the degree of integration in the image sensor. The gate electrode having at least one region thereof embedded in the semiconductor substrate may be applied to at least one of the driving transistor DX included in the first circuit 110 and the driving transistor DX included in the second circuit 120.

Figure 5:
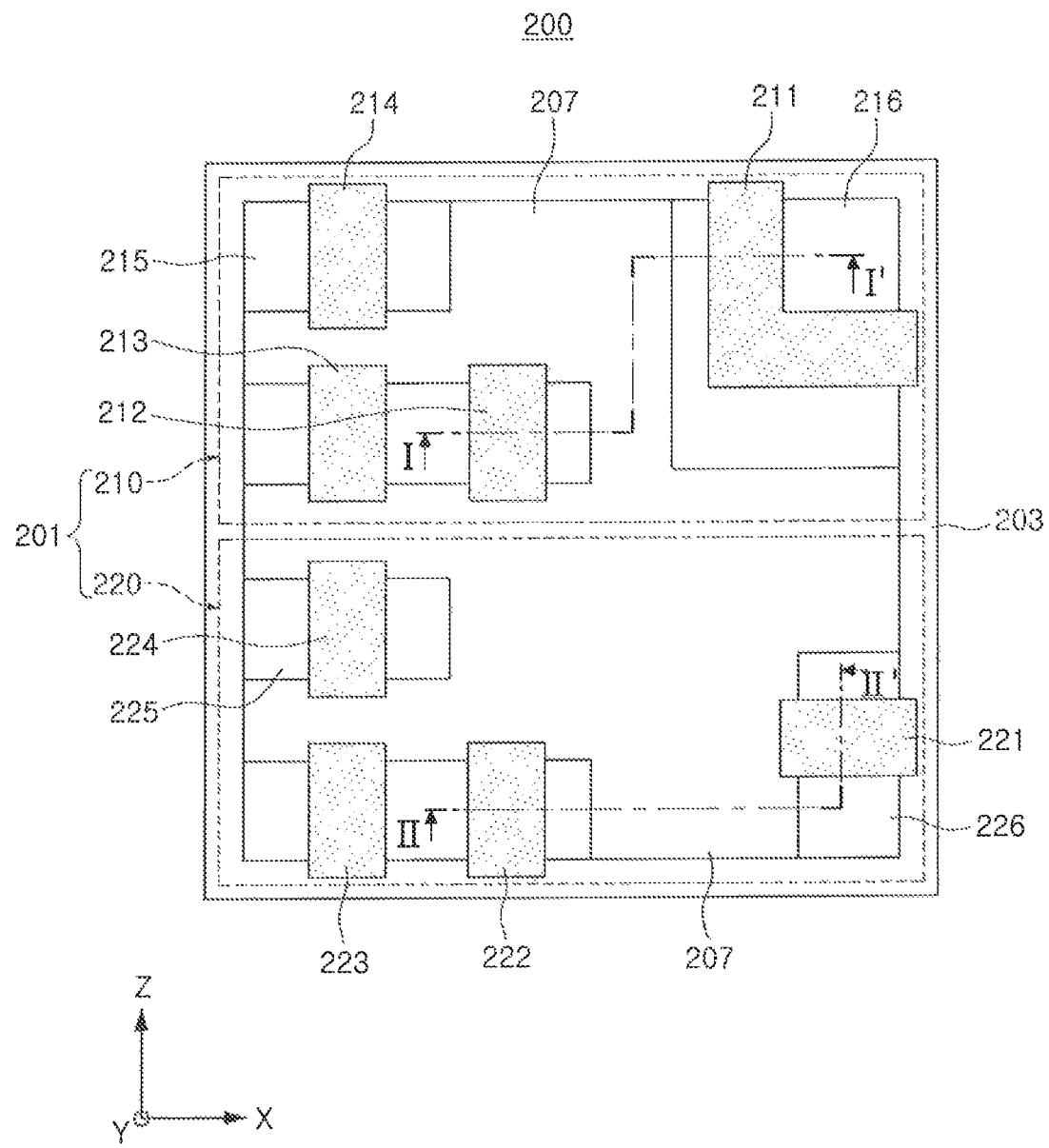
FIG. 5 is a view of a layout of a pixel included in an image sensor according to an exemplary embodiment of the inventive concept.

FIG. 5 is a view of a layout of a pixel included in an image sensor according to an exemplary embodiment of the inventive concept.

With reference to FIG. 5, a pixel 200, according to an exemplary embodiment of the inventive concept, may include an isolation region 203. The isolation region 203 may be formed using a deep trench isolation (DTI) process to prevent electrical and optical crosstalk phenomena between pixels disposed adjacently to one another. The isolation region 203 may include an oxide and the like. In addition, a side wall of the isolation region 203 may include a material having a high degree of reflectivity, such as polysilicon including boron (B) or the like.

The isolation region 203 may include a device isolation layer 207, source/drain regions 215 and 225, and the like, formed therein. The device isolation layer 207 may be formed using a shallow trench isolation (STI) process to electrically isolate at least a portion of a plurality of transistors TX, RX, SX, and DX (e.g., as described with reference to FIGS. 3A to 4C) included in the pixel 200. In addition, the device isolation layer 207 may have a relatively shallow depth compared to the isolation region 203.

A portion of the source/drain regions 215 and 225 may provide floating diffusions 216 and 226. In an exemplary embodiment of the inventive concept, the source/drain regions 215 and 225 may be doped with an n-type impurity. A portion of the source/drain regions 215 and 225 may intersect at least one of a plurality of gate electrodes 211, 212, 213, 214, 221, 222, 223, and 224. The plurality of gate electrodes 211, 212, 213, 214, 221, 222, 223, and 224, along with the source/drain regions 215 and 225, may form the plurality of transistors TX, RX, SX, and DX.

The pixel 200 included in the image sensor, according to an exemplary embodiment of the inventive concept, may include a plurality of photoelectric devices stacked in the stacking direction (e.g., the Z direction). In the present exemplary embodiment illustrated in FIG. 5, the pixel 200 may include a first photoelectric device and a second photoelectric device, which are stacked. A pixel circuit 201 may include a first circuit 210 and a second circuit 220, connected to the first photoelectric device and the second photoelectric device, respectively. According to an exemplary embodiment of the inventive concept, when a single pixel 200 includes three photoelectric devices, the pixel circuit 201 may also include three circuits. In other words, when a single pixel 200 includes n photoelectric devices, the pixel circuit 201 may also include n circuits.

The first circuit 210 may include the first source/drain region 215, a first transmission gate electrode 211, a first driving gate electrode 212, a first selection gate electrode 213, and a first reset gate electrode 214. A region of the first source/drain region 215, disposed adjacently to the first transmission gate electrode 211, may be provided as the first floating diffusion 216.

The first transmission gate electrode 211 may have a vertical gate structure extended from an upper surface (e.g., an X-Y plane) of the pixel 200 in a depth direction (e.g., the Z direction). In other words, the first transmission gate electrode 211 may extend in the depth direction perpendicular to the upper surface of the pixel 200, and may be disposed adjacently to the first photoelectric device disposed below the plurality of gate electrodes 211, 212, 213, and 214, the device isolation layer 207, and the floating diffusion 216. In an exemplary embodiment of the inventive concept, the first photoelectric device may be provided as a semiconductor photodiode disposed in the semiconductor substrate. A description of a layout structure of the first transmission gate electrode 211, the first photoelectric device, a color filter, and a microlens will be provided below with reference to FIG. 6, which illustrates a cross section taken along line I-I' of FIG. 5.

The second circuit 220 may include the second source/drain region 225, a second transmission gate electrode 221, a second driving gate electrode 222, a second selection gate electrode 223, and a second reset gate electrode 224. A region of the second source/drain region 225, disposed adjacently to the second transmission gate electrode 221, may be provided as the second floating diffusion 226. In other words, in the present exemplary embodiment illustrated in FIG. 5, the first circuit 210 and the second circuit 220 may include the same number of transistors.

As described above, as the number of transistors included in the pixel circuit 201 is increased, a size of each transistor may be reduced. When sizes of a first driving transistor and a second driving transistor, which undertake an amplifying operation, are reduced, properties may be degraded, causing RTS noise. In an exemplary embodiment of the inventive concept, at least one of the first driving gate electrode 212 and the second driving gate electrode 222 may be formed to have a structure in which a region thereof is embedded in the semiconductor substrate. Therefore, since a length of a channel of at least one of the first driving transistor and the second driving transistor may be increased, properties thereof may be prevented from being degraded.

Figure 6:
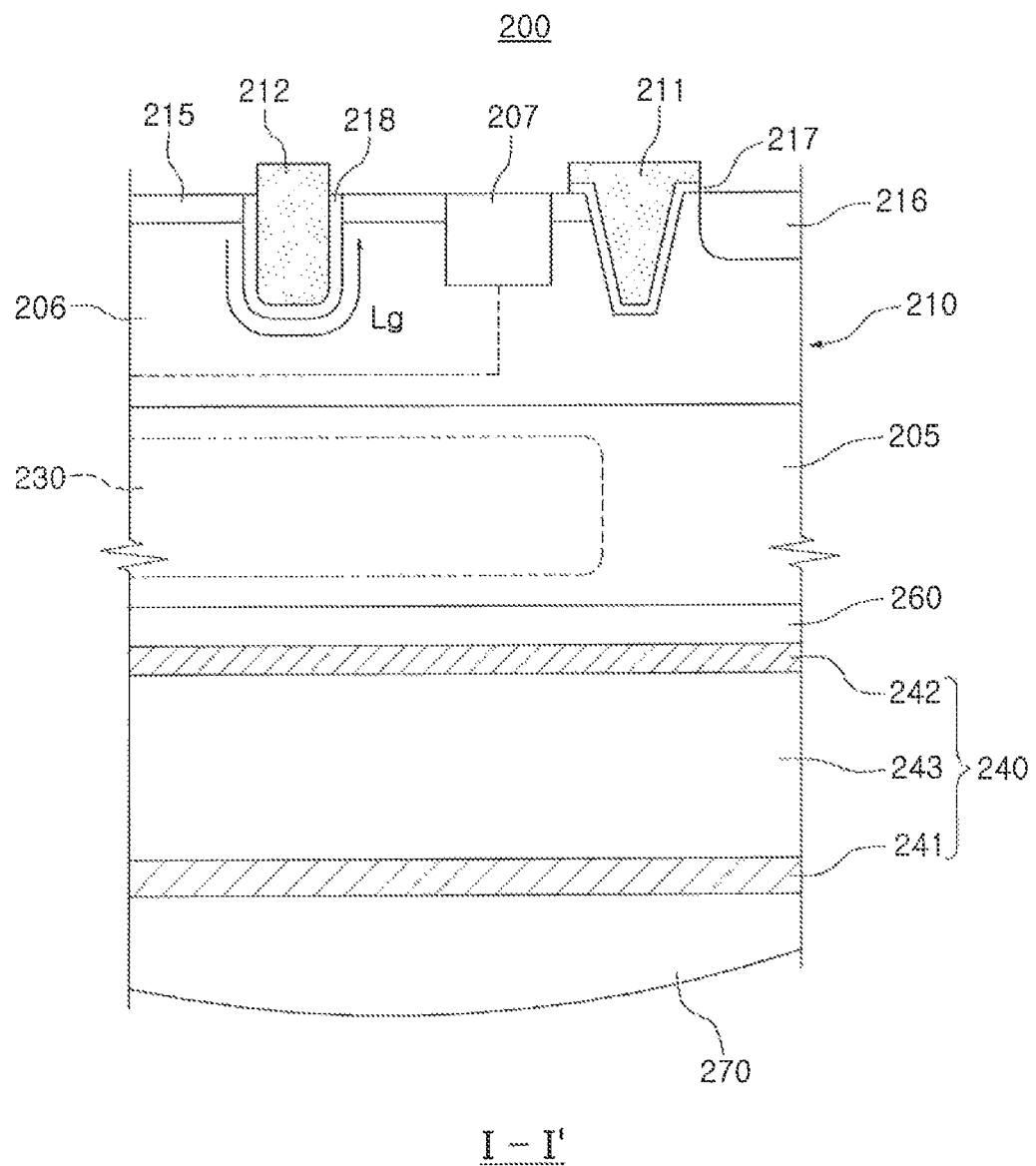
FIG. 6 is a cross-sectional view taken along line I-I' of the pixel of FIG. 5 according to an exemplary embodiment of the inventive concept.
Figure 7:
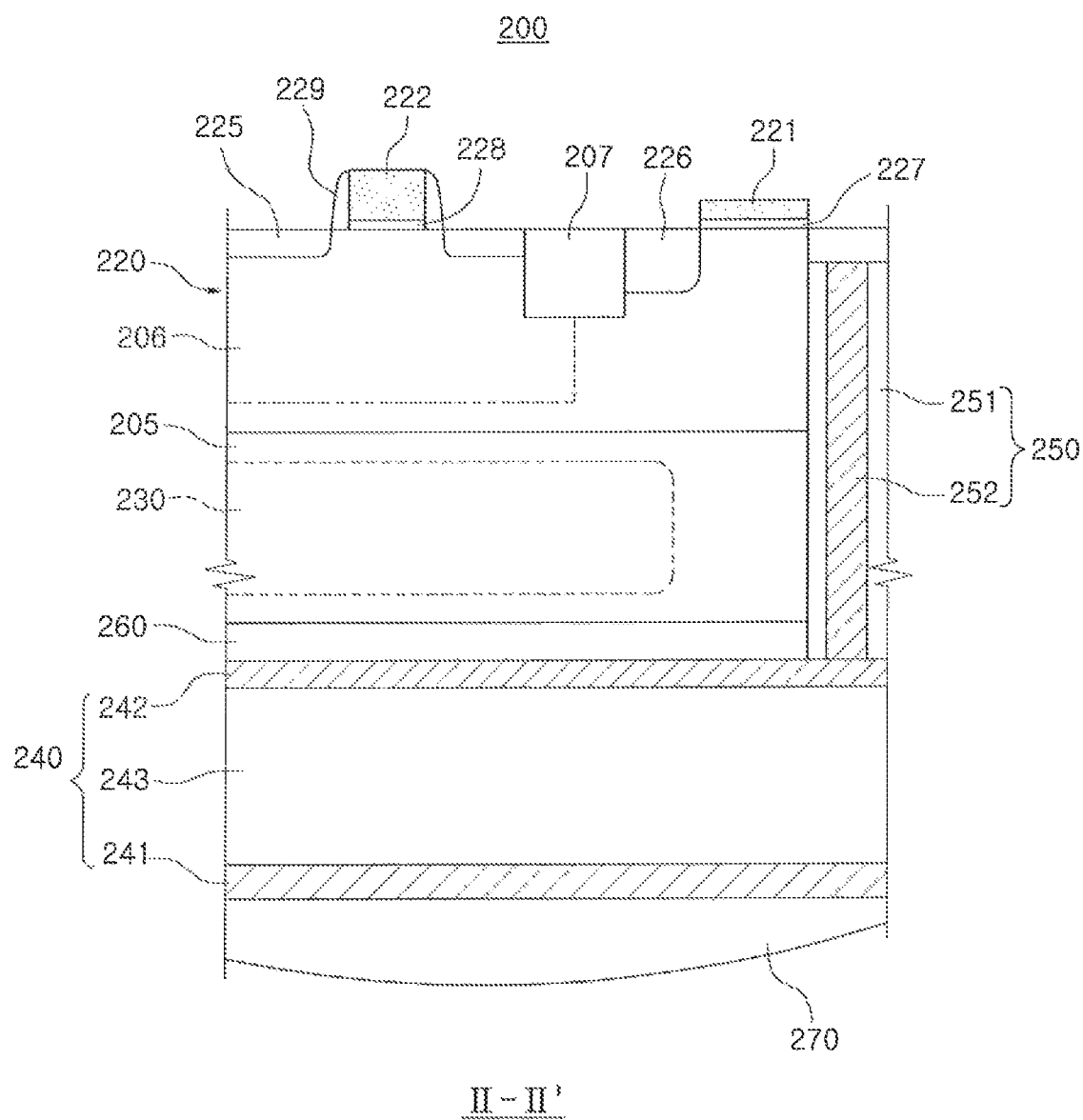
FIG. 7 is a cross-sectional view taken along line II-II' of the pixel of FIG. 5 according to an exemplary embodiment of the inventive concept.

FIG. 6 is a cross-sectional view taken along line I-I' of the pixel of FIG. 5 according to an exemplary embodiment of the inventive concept. FIG. 7 is a cross-sectional view taken along line II-II' of the pixel of FIG. 5 according to an exemplary embodiment of the inventive concept.

With reference to FIG. 6, the pixel 200 according to an exemplary embodiment of the inventive concept may have a structure in which first and second photoelectric devices 230 and 240 are stacked. The second photoelectric device 240 may be disposed adjacently to a microlens 270, while the first photoelectric device 230 may be disposed between the second photoelectric device 240 and the pixel circuit 201.

The first photoelectric device 230 and the second photoelectric device 240 may receive light having different wavelengths and generate an electric charge. In other words, the first photoelectric device 230 and the second photoelectric device 240 may receive light having different colors and generate an electric charge. In an exemplary embodiment of the inventive concept, the second photoelectric device 240 may receive green light and generate an electric charge, while the first photoelectric device 230 may receive light having a color other than green and generate an electric charge. A color filter 260 may be disposed between the first photoelectric device 230 and the second photoelectric device 240, and a wavelength of light transmitted to the first photoelectric device 230 may be determined by the color filter 260.

The first photoelectric device 230 may be disposed in a semiconductor substrate 205. The first photoelectric device 230 disposed in the semiconductor substrate 205 may be provided as a semiconductor photodiode. The second photoelectric device 240 may be provided as a photoelectric device including a material different from that of the first photoelectric device 230. In an exemplary embodiment of the inventive concept, the second photoelectric device 240 may be provided as an organic photodiode. The second photoelectric device 240 may include a first transparent electrode layer 241 and a second transparent electrode layer 242, which oppose each other, and further include a color selection layer 243 disposed therebetween and including an organic material and the like.

The first circuit 210 included in the pixel circuit 201 may include the device isolation layer 207, an impurity region 206, and the like. The impurity region 206 may be provided as a well region doped with a p-type impurity according to an exemplary embodiment of the inventive concept. A region of the impurity region 206 may be doped with an n-type impurity, and may provide the first source/drain region 215 and the first floating diffusion 216. The first source/drain region 215 and the first floating diffusion 216 may be doped with n+ conductivity using an ion implantation process.

The first transmission gate electrode 211 may be formed in a region disposed adjacently to the first floating diffusion 216. A portion of the first transmission gate electrode 211 may be embedded in the semiconductor substrate 205, thus extending in a direction perpendicular to the first photoelectric device 230. In other words, in an exemplary embodiment of the inventive concept, the first transmission gate electrode 211 may be a vertical transmission gate extended in a direction perpendicular to the first photoelectric device 230.

At least a region of the first driving gate electrode 212 included in the first circuit 210 may be embedded in the semiconductor substrate 205. Therefore, as illustrated in FIG. 6, a length Lg of the first driving gate electrode 212 may be increased, thus increasing a length of a channel of the first driving transistor. As a result, an image sensor having increased reliability and performance may be provided where the length of the channel of the driving transistor may be increased while the size of the pixel 200 of the image sensor is not increased. In addition, if necessary, space in which an additional transistor is integrated may be provided in the pixel circuit 201.

Gate insulating layers 217 and 218 may be disposed below the first transmission gate electrode 211 and the first driving gate electrode 212, respectively. The gate insulating layers 217 and 218 may include silicon dioxide ($SiO_x$), silicon oxynitride ($SiO_xN_y$), silicon nitride ($SiN_x$), germanium oxynitride ($GeO_xN_y$), silicon germanium oxynitride ($GeSi_xO_y$), or a material having a high dielectric constant. The material having a high dielectric constant may include at least one of $HfO_x$, zirconium oxide ($ZrO_x$), aluminum oxide ($AlO_x$), tantalum oxide ($TaO_x$), hafnium silicate ($HfSi_x$), or zirconium silicate ($ZrSi_x$). 'A high dielectric constant' may refer to a dielectric constant higher than that of a silicon oxide.

With reference to FIG. 7, the second circuit 220 may be connected to a second photoelectric device 240 by a via electrode 250. The via electrode 250 may include an insulating portion 251 and a conductive portion 252, and the conductive portion 252 may extend along a side wall of the pixel 200. In the present exemplary embodiment of FIG. 7, one side of the via electrode 250 may be connected to a second transparent electrode layer 242 of the second photoelectric device 240. In addition, an opposing side may be connected to the source/drain region 225 disposed adjacently to a side of the second transmission gate electrode 221. An electric charge generated in the second photoelectric device 240 may be accumulated in the second floating diffusion 226 by a voltage applied to the second transmission gate electrode 221.

Unlike the first driving gate electrode 212, the second driving gate electrode 222 may be disposed on an upper surface of the semiconductor substrate 205. Unlike the first transmission gate electrode 211 having a vertical gate structure, the second transmission gate electrode 221 may also be disposed on the upper surface of the semiconductor substrate 205. Gate insulating layers 227 and 228 may be disposed below the second transmission gate electrode 221 and the second driving gate electrode 222, respectively, while a spacer 229 may be disposed on a side surface of the second driving gate electrode 222.

In other words, in the pixel 200 according to the exemplary embodiments illustrated in FIGS. 5 to 7, the first circuit 210 and the second circuit 220 may have different structures. The first transmission gate electrode 211 and the first driving gate electrode 212, included in the first circuit 210, may have a structure in which a region thereof is embedded in the semiconductor substrate 205. On the other hand, the second transmission gate electrode 221 and the second driving gate electrode 222, included in the second circuit 220, may be disposed on the upper surface of the semiconductor substrate 205. Alternatively, however, at least one of the gate electrodes 221, 222, 223, and 224, included in the second circuit 220, may have a region embedded in the semiconductor substrate 205.

Figure 8:
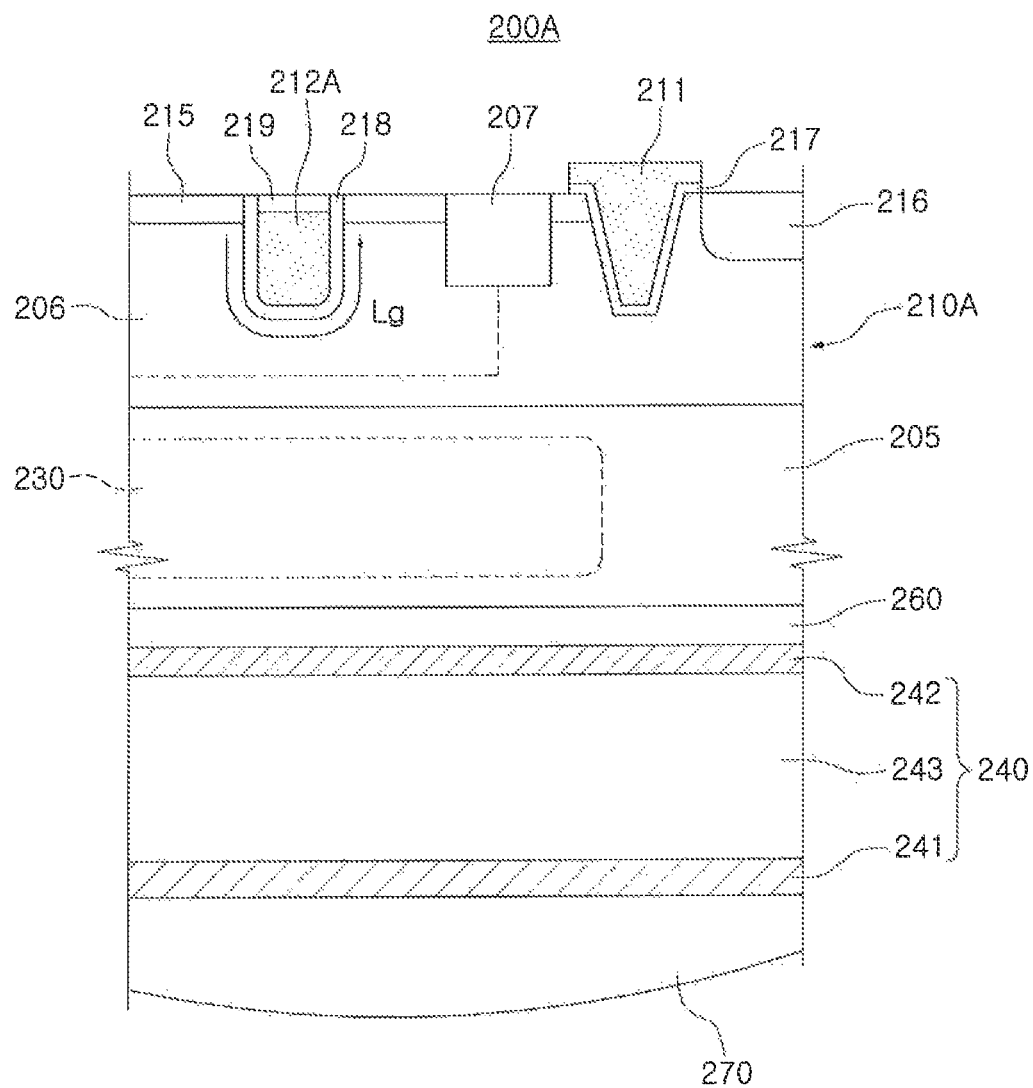
FIGS. 8 and 9 are cross-sectional views of a pixel included in an image sensor according to exemplary embodiments of the inventive concept.
Figure 9:
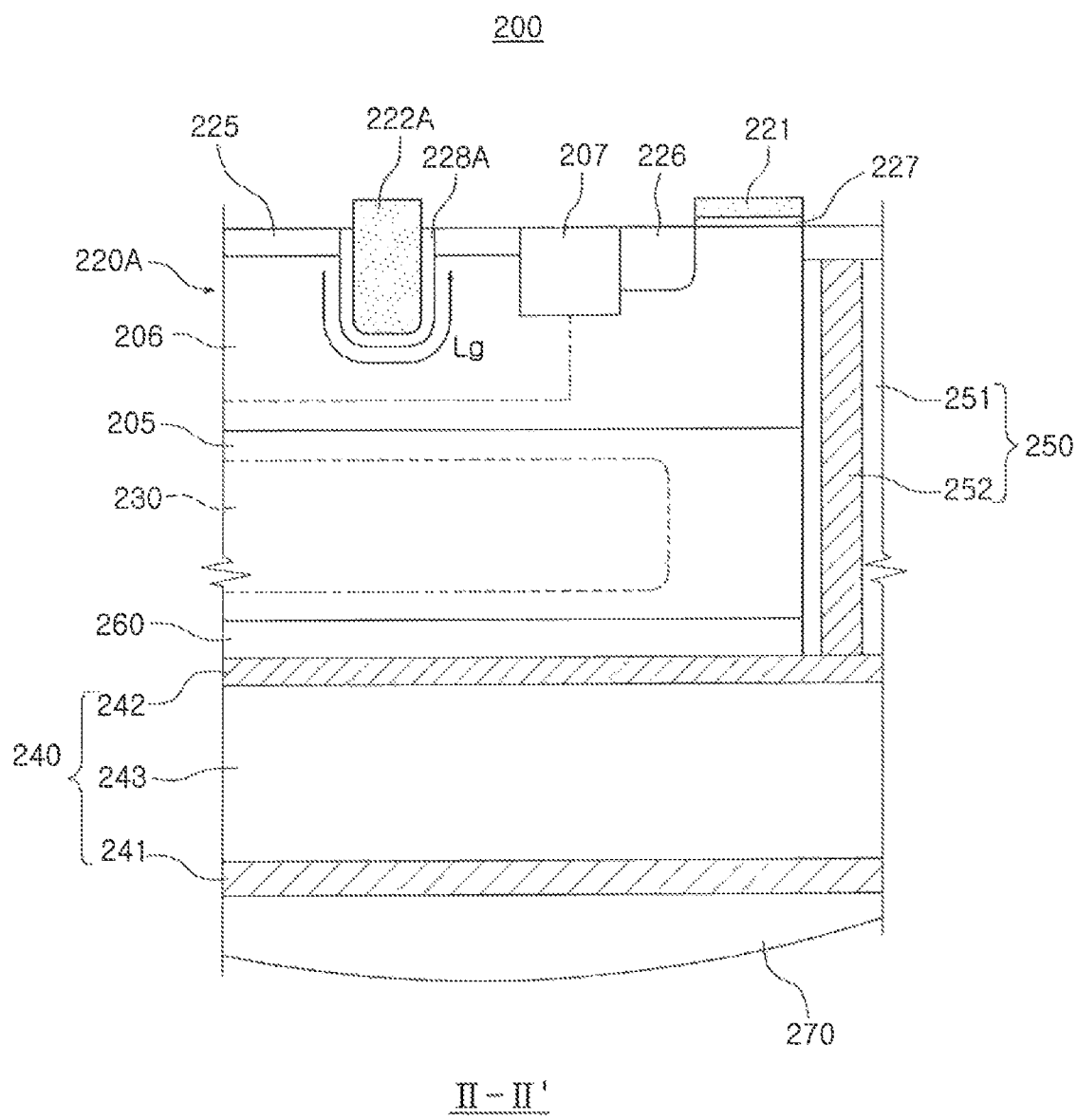

FIGS. 8 and 9 are cross-sectional views of a pixel included in an image sensor according to exemplary embodiments of the inventive concept. A planar layout of a pixel 200A illustrated in FIGS. 8 and 9 may be similar to that of the pixel 200 of FIG. 5. As such, hereinafter, descriptions of similar components or configurations may be omitted.

With reference to FIG. 8, an entirety of a first driving gate electrode 212A included in a first circuit 210A may be embedded in the semiconductor substrate 205. The gate insulating layer 218 may be disposed below the first driving gate electrode 212A, while a capping layer 219 including an insulating material may be disposed on the first driving gate electrode 212A. An upper surface of the capping layer 219 may be coplanar with an upper surface of the semiconductor substrate 205. With reference to FIG. 8, the upper surface of the capping layer 219 may be coplanar with upper surfaces of the source/drain region 215, the device isolation layer 207, and the first floating diffusion 216.

With reference to FIG. 9, a region of a second driving gate electrode 222A included in a second circuit 220A may be embedded in the semiconductor substrate 205. A gate insulating layer 228A disposed below the second driving gate electrode 222A may also be embedded in the semiconductor substrate 205. A region of the second driving gate electrode 222A may be embedded in the semiconductor substrate 205, thus increasing the length Lg and the length of the channel of the second driving transistor. Therefore, properties of the second driving transistor may be prevented from being degraded.

In the exemplary embodiments illustrated in FIGS. 7 and 9, the second transmission gate electrode 221 included in the second circuit 220 or 220A is illustrated as being disposed on the semiconductor substrate 205, but the inventive concept is not limited thereto. In other words, similar to the first transmission gate electrode 211, a portion of the second transmission gate electrode 221 included in the second circuit 220 or 220A may be embedded in the semiconductor substrate 205 and have a vertical gate structure extending toward the first photoelectric device 230.

With reference to FIGS. 7 and 9, the second photoelectric device 240 may be directly connected to a portion of the source/drain region 225 by the via electrode 250. According to an exemplary embodiment of the inventive concept, the second photoelectric device 240 may be connected to a metal wiring disposed on the semiconductor substrate 205 through the via electrode 250, and may be connected to the source/drain region 225 through the metal wiring.

Figure 10:
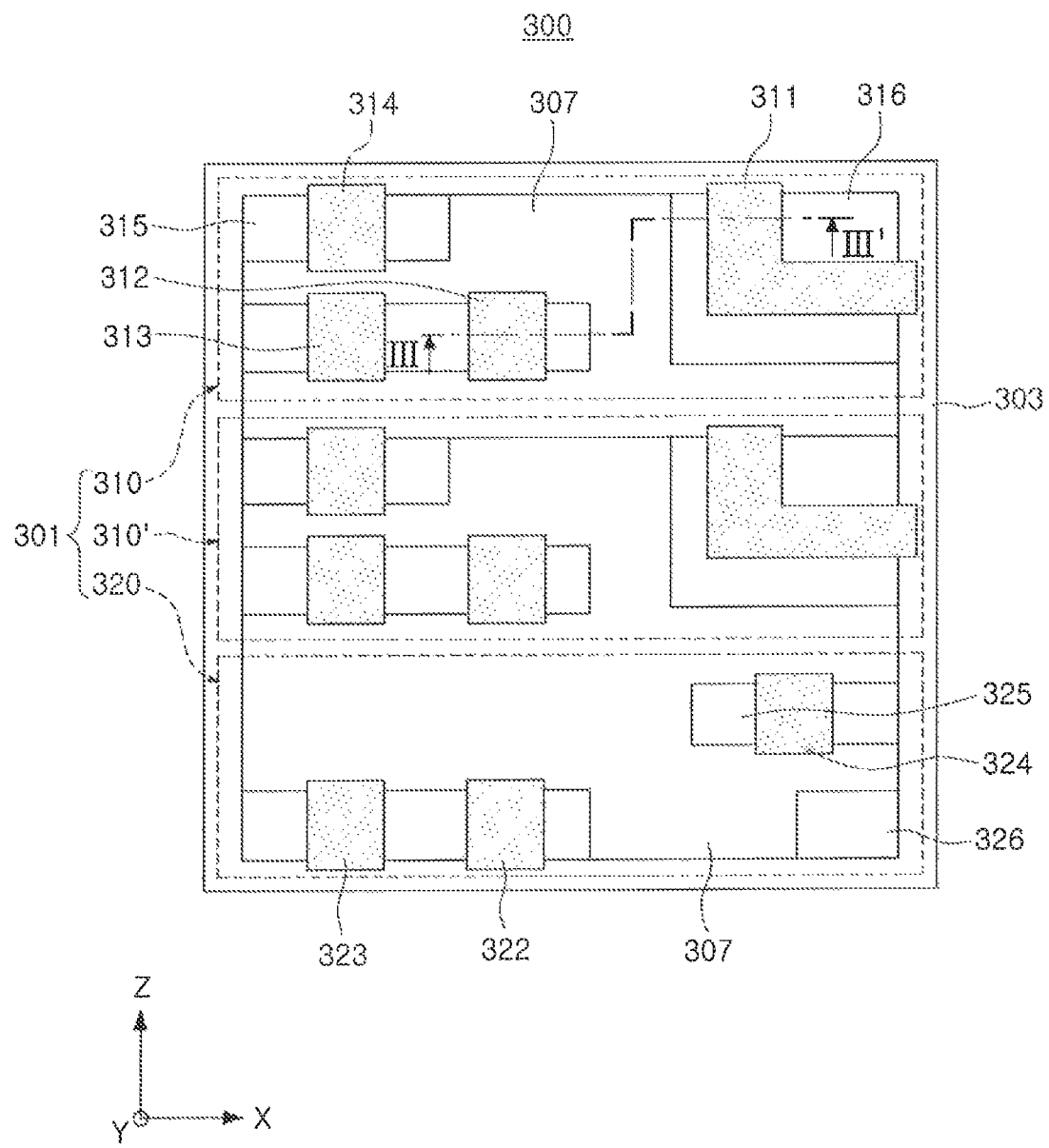
FIG. 10 is a view of a layout of a pixel included in an image sensor according to an exemplary embodiment of the inventive concept.

FIG. 10 is a view of a layout of a pixel included in an image sensor according to an exemplary embodiment of the inventive concept.

With reference to FIG. 10, a pixel 300 of the image sensor, according to an exemplary embodiment of the inventive concept, may include a pixel circuit 301 having a first circuit 310, a second circuit 310', and a third circuit 320. Each of the first circuit 310, the second circuit 310', and the third circuit 320 may include a plurality of transistors. In the present exemplary embodiment illustrated in FIG. 10, the first circuit 310 and the second circuit 310' may include four transistors, while the third circuit 320 may include three transistors. In other words, the third circuit 320 may include have a structure different from those of the first circuit 310 and the second circuit 310'. In addition, unlike the first circuit 310 and the second circuit 310', the transmission transistor TX may not be included in the third circuit 320. The first circuit 310 and the second circuit 310' may have substantially the same structure.

The plurality of transistors included in the pixel circuit 301 may be formed by source/drain regions 315 and 325 and gate electrodes 311, 312, 313, 314, 322, 323, and 324. In an exemplary embodiment of the inventive concept, the source/drain regions 315 and 325 may be provided as a region doped with an n-type impurity, and may be separated from each other through a device isolation layer 307. The device isolation layer 307 may be formed using an STI process, and may include an insulating material. An isolation region 303, to allow pixels disposed adjacently to be separated from one another, may be disposed in a margin portion of the pixel 300. The isolation region 303 may be formed using a DTI process, and may have a depth greater than that of the device isolation layer 307.

Figure 11:
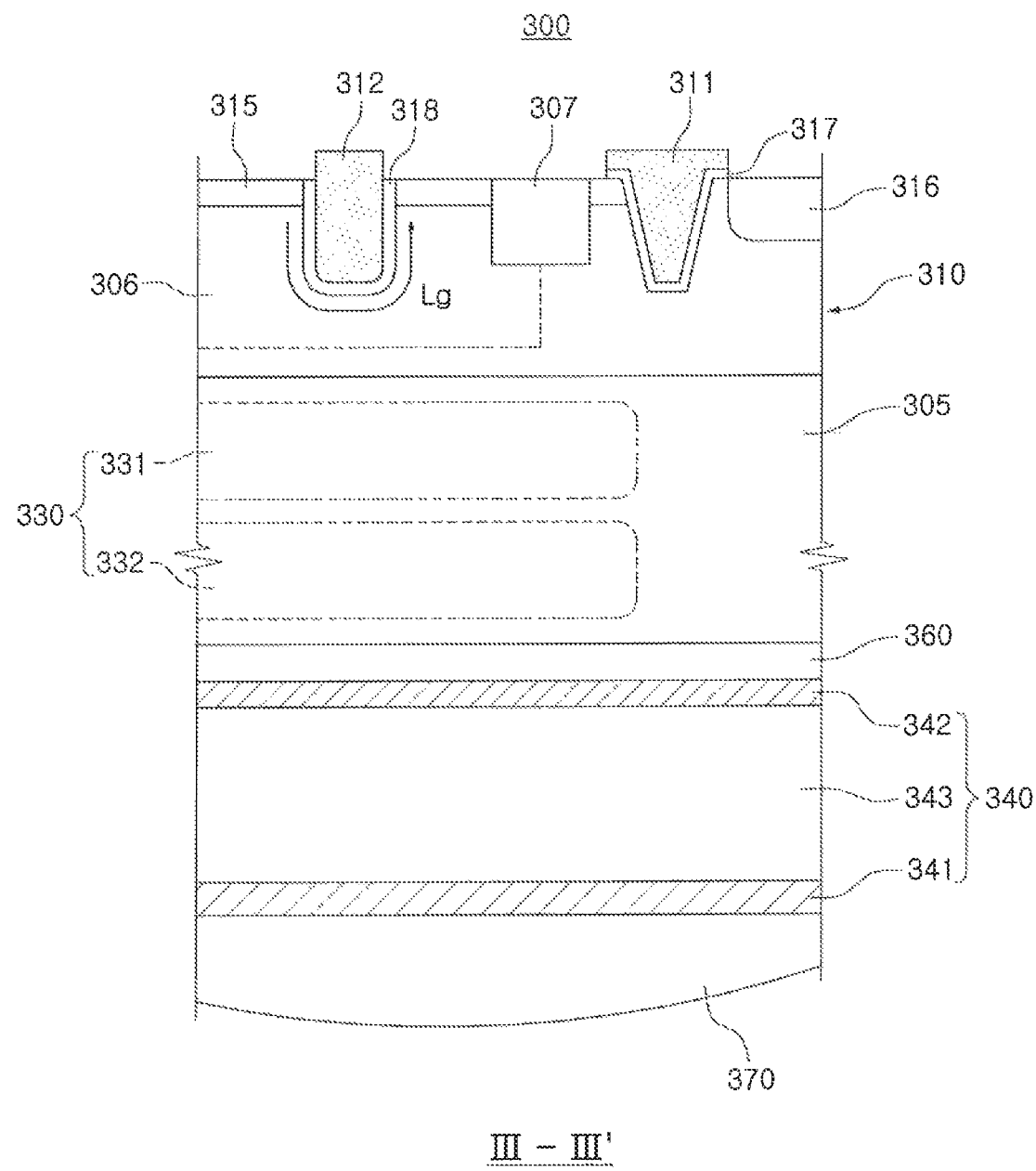
FIGS. 11 and 12 are cross-sectional views taken along III-III' of the pixel of FIG. 10 according to exemplary embodiments of the inventive concept.
Figure 12:
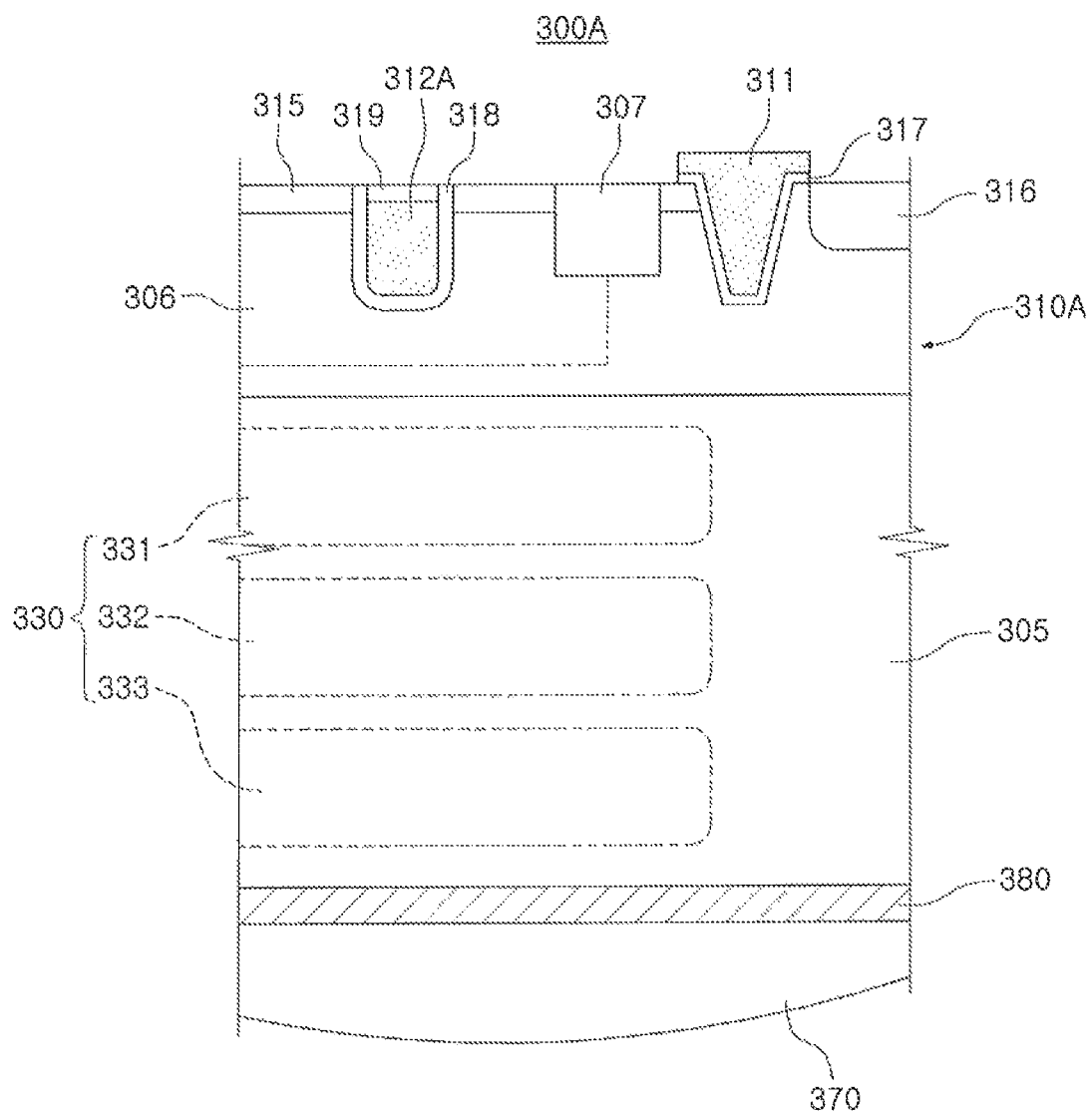

FIGS. 11 and 12 are cross-sectional views taken along line III-III' of the pixel of FIG. 10 according to exemplary embodiments of the inventive concept. In particular, FIG. 12 is a cross-sectional view taken along line III-III' of a pixel 300A, which may be similar to the pixel 300 of FIG. 10.

In an exemplary embodiment of the inventive concept illustrated in FIG. 11, the first circuit 310 may include a first transmission gate electrode 311 having a vertical gate structure. A region of the first transmission gate electrode 311 may be embedded in a semiconductor substrate 305 to extend in a direction toward photoelectric devices 330 and 340. A first floating diffusion 316 may be disposed in a region disposed adjacently to the first transmission gate electrode 311.

A first driving gate electrode 312 may have a structure in which a region thereof is embedded in the semiconductor substrate 305. A gate insulating layer 318 and an impurity region 306 may be disposed below the first driving gate electrode 312. A channel region may be disposed in the impurity region 306 according to a voltage applied to the first driving gate electrode 312, and the channel region may be formed along a lower surface of the first driving gate electrode 312. Accordingly, a length of the channel region may be increased, while a physical size of the first driving gate electrode 312 is not increased. Therefore, properties of a first driving transistor including the first driving gate electrode 312 may be enhanced.

Three photoelectric devices (e.g., 331, 332, and 340) may be disposed below the pixel circuit 301 of FIG. 10. A photoelectric device 330 may include a first photoelectric device 331 and a second photoelectric device 332. The first photoelectric device 331 and the second photoelectric device 332 may be provided as a semiconductor photodiode formed in the semiconductor substrate 305. In addition, a third photoelectric device 340 may be provided as an organic photodiode including a first transparent electrode layer 341, a second transparent electrode layer 342, and a color selection layer 343 including an organic material. In an exemplary embodiment of the inventive concept, the first photoelectric device 331 and the second photoelectric device 332 may be connected to the first circuit 310 and the second circuit 310', respectively. In addition, the third photoelectric device 340 may be connected to the third circuit 320.

The first photoelectric device 331, the second photoelectric device 332, and the third photoelectric device 340 may receive light having different wavelengths and generate an electric charge. In an exemplary embodiment of the inventive concept, the third photoelectric device 340 may generate an electric charge from light having a wavelength corresponding to the color green. In addition, the first photoelectric device 331 and the second photoelectric device 332 may generate an electric charge from light having a wavelength corresponding to a color other than green. In an exemplary embodiment of the inventive concept, the first photoelectric device 331 and the second photoelectric device 332 may generate an electric charge from red and blue light, respectively. In this case, the first photoelectric device 331 disposed most adjacently to the pixel circuit 301 may receive the red light having a relatively long wavelength and generate the electric charge.

In the pixel 300A according to an exemplary embodiment of the inventive concept illustrated in FIG. 12, an entirety of a first driving gate electrode 312A may be embedded in the semiconductor substrate 305. A capping layer 319 including an insulating material may be formed on an upper surface of the first driving gate electrode 312A, while the gate insulating layer 318 may be disposed below the first driving gate electrode 312A. The first transmission gate electrode 311 may have a vertical gate structure similar to that illustrated in FIG. 11.

The pixel 300A may include three photoelectric devices (e.g., 331 to 333) stacked below the pixel circuit 301. The photoelectric device 330 may be stacked in the semiconductor substrate 305, and may include the first photoelectric device 331, the second photoelectric device 332, and the third photoelectric device 333. The first photoelectric device 331, the second photoelectric device 332, and the third photoelectric device 333 may receive light having different colors and generate an electric charge. In this case, the first photoelectric device 331, disposed furthest from a microlens 370 receiving light and an anti-reflection layer 380, may receive light having the longest wavelength and generate the electric charge. In addition, the third photoelectric device 333 may receive light having the shortest wavelength and generate the electric charge. An entirety of the first photoelectric device 331, the second photoelectric device 332, and the third photoelectric device 333 may be provided as a semiconductor photodiode, but the inventive concept is not limited thereto. In other words, at least one of the first photoelectric device 331, the second photoelectric device 332, and the third photoelectric device 333 may be provided as an organic photodiode or a quantum dot.

The anti-reflection layer 380 may be disposed between the photoelectric device 330 and the microlens 370, thus preventing incident light from being reflected. In an exemplary embodiment of the inventive concept, in order to prevent dark current, a doped layer including a p-type impurity or an insulating layer may be additionally disposed between a lower surface of the semiconductor substrate 305 and the anti-reflection layer 380.

In the exemplary embodiments illustrated in FIGS. 11 and 12, three photoelectric devices are included in the pixel 300 or 300A, but the inventive concept is not limited thereto. For example, the number of photoelectric devices may be four or more. The pixel 300 or 300A of an image sensor, according to an exemplary embodiment of the inventive concept, may include a plurality of photoelectric devices stacked below the pixel circuit 301, and the number of photoelectric devices may vary.

Figure 13:
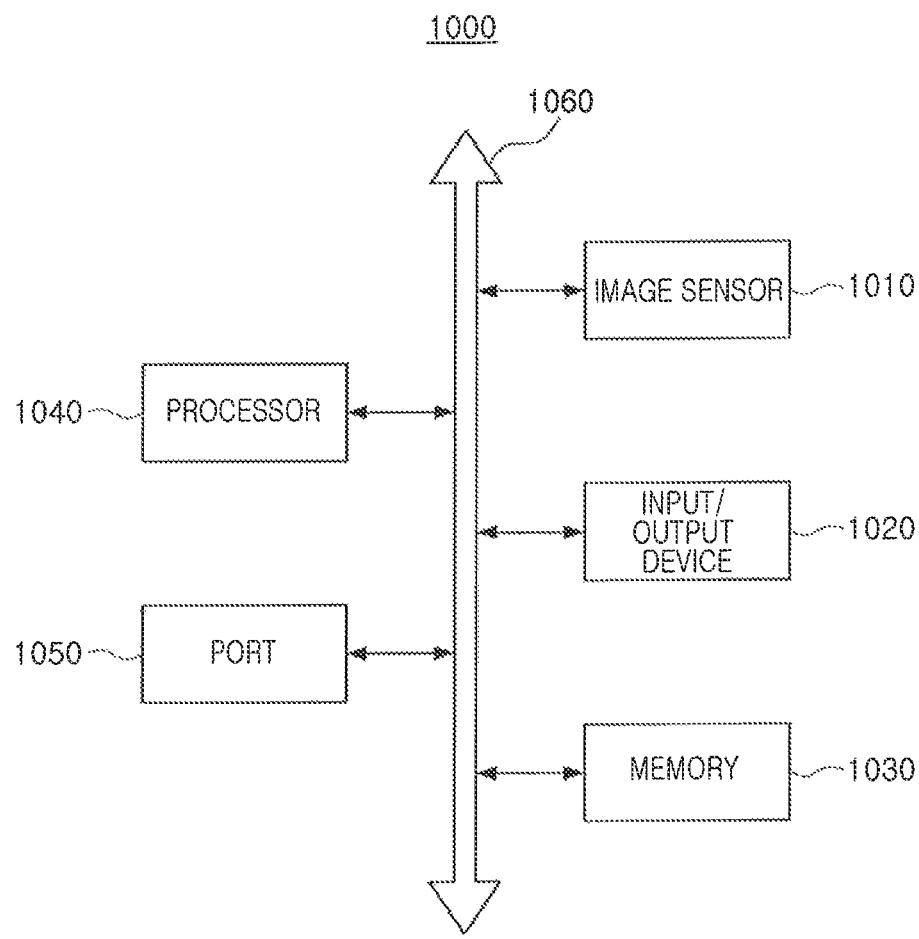
FIG. 13 is a view of an electronic device including an image processing device according to an exemplary embodiment of the inventive concept.

FIG. 13 is a view of an electronic device including an image processing device according to an exemplary embodiment of the inventive concept.

With reference to FIG. 13, an image sensor 1010, according to an exemplary embodiment of the inventive concept, may be included in a computer device 1000. The computer device 1000 may include an input/output device 1020, a memory 1030, a processor 1040, a port 1050, and the like, in addition to the image sensor 1010. The computer device 1000 may further include a wired/wireless communications device, a power device, and the like. The port 1050 may allow the computer device 1000 to communicate with a video card, a sound card, a memory card, a universal serial bus (USB) device, or the like. The computer device 1000 may be a smartphone, a tablet PC, a smart wearable device, a desktop computer, a laptop computer, etc.

The processor 1040 may perform a specific operation, a command, a task, or the like. The processor 1040 may be provided as a central processing unit (CPU) or a microprocessor unit (MCU), and may communicate with the memory 1030, the input/output device 1020, the image sensor 1010, and other devices connected to the port 1050, through a bus 1060.

The memory 1030 may be provided as a storage medium for storing data needed to operate the computer device 1000, multimedia data, or the like. The memory 1030 may include a volatile memory, such as a random-access memory (RAM), or a non-volatile memory, such as a flash memory or the like. In addition, the memory 1030 may be provided as a storage device, and may include at least one of a solid state drive (SSD), a hard disk drive (HDD), or an optical drive (ODD). The input/output device 1020 may include an input device, such as a keyboard, a mouse, a touchscreen, or the like, and an output device, such as a display, an audio output portion, or the like, which are provided to a user.

The image sensor 1010 may be connected to the processor 1040 by the bus 1060 or a different communications device. The processor 1040 may perform a function of the image processor 20 of FIG. 1. The image sensor 1010 may be provided according to the exemplary embodiments described above with reference to FIGS. 1 to 12. For example, the image sensor 1010 may include the pixel 100, 200, 200A, 300, or 300A.

In other words, the image sensor 1010 may include one or more driving transistors. In addition, at least one of the driving transistors may have a structure in which a region thereof is embedded in a semiconductor substrate. Therefore, a length of a channel of the driving transistor may be increased while a physical size of the driving transistor is not increased. As a result, properties of the image sensor 1010 may be enhanced, and a degree of integration in the image sensor 1010 is not reduced.

As set forth above, according to exemplary embodiments of the inventive concept, at least one region of a driving gate electrode may be embedded in a semiconductor substrate, thus increasing a length of a channel of a driving transistor and preventing degradation of properties of the driving transistor. Therefore, in a structure in which a single pixel includes a plurality of different photoelectric devices, performance of a pixel circuit therein that includes the above-described driving transistor may be prevented from being degraded.

While the inventive concept has been shown and described above with reference to the exemplary embodiments thereof, it will be apparent to those of ordinary skill in the art that modifications and variations in form and details could be made thereto without departing from the spirit and scope of the present inventive concept as defined by the following claims.

What is claimed is:

1. An image sensor, comprising:
 a semiconductor substrate providing a plurality of pixel regions;
 a first semiconductor photoelectric device disposed in each of the plurality of pixel regions;
 a second semiconductor photoelectric device disposed in the each of the plurality of pixel regions;
 an organic photoelectric device disposed above the first and the second semiconductor photoelectric devices;
 a microlens disposed on the organic photoelectric device;
 a color filter disposed between the organic photoelectric device and the first semiconductor photoelectric device; and
 a pixel circuit disposed below the first and the second semiconductor photoelectric devices,
 wherein the pixel circuit includes a plurality of driving transistors configured to generate a pixel voltage signal from an electric charge generated in the first and the second semiconductor photoelectric devices, and the organic photoelectric device, and
 a driving gate electrode of at least one of the plurality of driving transistors has a region embedded in the semiconductor substrate.

2. The image sensor of claim 1, wherein the pixel circuit comprises a first circuit connected to the first semiconductor photoelectric device and a second circuit connected to the organic photoelectric device, and the first circuit comprises a first driving transistor and the second circuit comprises a second driving transistor.

3. The image sensor of claim 2, wherein the number of transistors included in the first circuit is greater than the number of transistors included in the second circuit.

4. The image sensor of claim 2, wherein the number of transistors included in the first circuit is the same as the number of transistors included in the second circuit.

5. The image sensor of claim 2, wherein the first circuit comprises a first floating diffusion configured to accumulate the electric charge generated in the first semiconductor photoelectric device and a first transmission transistor configured to transmit the electric charge generated in the first semiconductor photoelectric device to the first floating diffusion, and the first transmission transistor includes a transmission gate electrode extending in a direction towards the first semiconductor photoelectric device and having at least a portion embedded in the semiconductor substrate.

6. The image sensor of claim 1, wherein the at least one of the plurality of driving transistors is entirely embedded in the semiconductor substrate, and comprises a capping layer on an upper surface of the driving gate electrode.

7. The image sensor of claim 6, wherein an upper surface of the capping layer is coplanar with an upper surface of the semiconductor substrate.

8. The image sensor of claim 1, wherein the first semiconductor photoelectric device and the second semiconductor photoelectric device are stacked in a direction perpendicular to an upper surface of the semiconductor substrate, and the first semiconductor photoelectric device and the second semiconductor photoelectric device are configured to receive light having different wavelengths and generate the electric charge.

9. The image sensor of claim 8, wherein the first semiconductor photoelectric device is disposed between the second semiconductor photoelectric device and the organic photoelectric device, receives light having a wavelength shorter than a wavelength of light received by second semiconductor photoelectric device, and generates the electric charge.

10. The image sensor of claim 1, wherein the first semiconductor photoelectric device and the organic photoelectric device receive light having different wavelengths and generate the electric charge.

11. The image sensor of claim 1, wherein a main carrier of the electric charge generated in the first semiconductor photoelectric device is an electron carrier and a main carrier of the electric charge generated in the organic photoelectric device is a hole carrier.

12. The image sensor of claim 1, wherein the organic photoelectric device comprises a first transparent electrode layer and a second transparent electrode layer, which are disposed in parallel with each other, and a color selection layer disposed between the first transparent electrode layer and the second transparent electrode layer, and the color section layer includes an organic material.

13. An image sensor, comprising:
a first organic photodiode on a substrate;
a second organic photodiode on the first semiconductor photoelectric device;
a third organic photodiode on the second semiconductor photoelectric device;
a microlens disposed on the third organic photodiode;
a pixel circuit disposed below the first organic photodiode,
wherein the pixel circuit includes a plurality of driving transistors, each of the plurality of driving transistors configured to generate a pixel voltage signal from an electric charge generated in each of the first, second and third organic photodiodes,
wherein the pixel circuit comprises a first circuit connected to the first organic photodiode and a second circuit connected to the second organic photodiode, and
wherein a driving gate electrode of a driving transistor of the first circuit has a region embedded in the semiconductor substrate and a driving gate electrode of a driving transistor of the second circuit is disposed on a surface of the semiconductor substrate.

14. The image sensor of claim 13, wherein the pixel circuit further comprises:
a third circuit connected to the third organic photodiode.

15. The image sensor of claim 14, wherein the number of transistors included in the first circuit is the same as the number of transistors included in the second circuit.

16. The image sensor of claim 13, wherein the first, the second and the third organic photodiodes generate the electric charge in response to light having different wavelengths, respectively.

* * * * *